United States Patent [19]
van de Venne

[11] Patent Number: 4,583,087
[45] Date of Patent: Apr. 15, 1986

[54] MATRIX DISPLAY DEVICE WITH DIODE SWITCHING ELEMENTS

[75] Inventor: Joannes L. M. van de Venne, Eindhoven, Netherlands

[73] Assignee: U.S. Philips Corporation, New York, N.Y.

[21] Appl. No.: 396,989

[22] Filed: Jul. 9, 1982

[30] Foreign Application Priority Data

Jul. 16, 1981 [NL] Netherlands .................. 8103376

[51] Int. Cl.⁴ .................. G09G 3/02; H01L 29/90
[52] U.S. Cl. .................. 340/719; 357/13; 357/45
[58] Field of Search .................. 340/719, 718; 357/4, 357/13, 45, 33, 15

[56] References Cited

U.S. PATENT DOCUMENTS

| | | | |
|---|---|---|---|
| 4,149,174 | 4/1979 | Shannon | 357/15 X |
| 4,223,308 | 9/1980 | Baraff et al. | 340/719 |
| 4,247,915 | 1/1981 | Bartlett | 357/13 X |
| 4,251,136 | 2/1981 | Miner et al. | 340/719 X |
| 4,254,427 | 3/1981 | Lohstroh | 357/13 |
| 4,373,165 | 2/1983 | Tasch, Jr. | 357/13 |
| 4,405,933 | 9/1983 | Avery | 357/13 |
| 4,434,433 | 2/1984 | Nishizawa | 357/13 X |

Primary Examiner—Marshall M. Curtis
Assistant Examiner—Vincent P. Kovalick
Attorney, Agent, or Firm—Robert J. Kraus

[57] ABSTRACT

In order to provide a passive electro-optical display medium in a matrix display device with a sufficiently steep threshold with respect to the applied voltage and having a memory, a switching element (9) is placed in series having each picture element. The switching element (9) is provided between a picture electrode (6) of each picture element and a driving electrode (8). The switching element (9) is formed by a polysilicon island (20) in which n⁺-doped regions (22,23) are provided which are separated by a p-doped region (21). As a result of this, two series-arranged, oppositely directed p-n junctions are formed of which one is always reverse biased. The width of the p-doped regions is so small that punch-through occurs between the two p-n junctions before one of the p-n junctions breaks down. Due to the occurrence of punch-through, the series resistance of the switching element is negligibly small so that a favorable $R_{ON}/R_{OFF}$ ratio is obtained and the picture elements can be driven with comparatively low voltages.

6 Claims, 6 Drawing Figures

MATRIX DISPLAY DEVICE WITH DIODE SWITCHING ELEMENTS

BACKGROUND OF THE INVENTION

The invention relates to a display device comprising an electro-optical display medium between two supporting plates, a system of picture elements arranged in rows and columns, in which each picture element is defined by two picture electrodes provided respectively on the facing surfaces of the supporting plates, and a system of row and column electrodes for driving the picture elements. The row electrodes are provided on one supporting plate and the column electrodes are provided on the other supporting plate. A system of switching elements are provided in which each switching element is incorporated between a row electrode and a column electrode in series with a respective picture element. Each switching element is formed by two series-arranged, oppositely-directed diodes.

Such a display medium is suitable for displaying alphanumerical information and video information by means of passive electro-optical display media, such as liquid crystals, electrophoretic suspensions and electrochromic materials.

The known passive electro-optical display media generally have an insufficiently steep threshold with respect to the applied voltage and/or have an insufficient intrinsic memory. In multiplexed matrix display devices these properties are the cause that the number of lines to be driven is small. Due to the lack of memory, the information presented to a selected row electrode via the column electrodes has to be written over and over again. Moreover, the voltages presented to the column electrodes are present not only across the picture elements of a driven row electrode, but also across the picture elements of all the other rows. Therefore picture elements, during the time they are not driven, experience an effective voltage which may be sufficient to bring a picture element to the on-condition. Furthermore, the ratio of the effective voltage which a picture element experiences in the on and off-conditions, respectively, decreases when the number of row electrodes increases. Due to the lack of a sufficiently steep threshold, the contrast between picture elements in the on- and off-condition decreases.

It is known that the number of rows which can be driven may be increased by integrating an extra switch per picture element. This switch ensures a sufficiently steep threshold with respect to the applied voltage and ensures that the information presented to a driven row electrode remains across a picture element during the time the remaining row electrodes are driven. The switch also prevents a picture element from experiencing an effective voltage during the time it is not driven.

A display device of a kind mentioned in the opening paragraph is disclosed in U.S. Pat. No. 4,223,308. This known display device uses as switching elements two series-arranged, oppositely directed diodes (back-to-back diodes). These switching elements are symmetrical with respect to a voltage zero, which is desired because liquid crystal display devices are operated with alternating voltage to prevent degradation of the liquid crystal in the case of direct voltage control. One of the two back-to-back diodes is always in the reverse direction so that the threshold voltage is determined by the breakdown voltage of that diode.

These known back-to-back diodes are formed by two p-n-junctions which are interconnected by means of a conductor. However, this structure has the disadvantage that the p-n structures have a voltage-dependent series resistance which is particularly large when one of the regions of the p-n structures is lightly doped, notably in amorphous and polycrystalline semiconductor materials. This means that upon energizing a picture element at the threshold voltage of the electro-optical effect, the voltage drop across the series resistance of the switching element has to be added in addition to the threshold voltage of the switching element, so that the resistance in the on-condition is unfavourably influenced and an unfavourable switching ratio is obtained. The switching ratio is the ratio between the resistance of the switching element in the on and off states.

SUMMARY OF THE INVENTION

It is therefore the object of the invention to provide a switching element with which a better switching ratio is obtained and with which lower voltages for driving the display device are possible.

A display device of the kind mentioned in the opening paragraph is for that purpose characterized in that the two diodes are formed by a semiconductor region of the first conductivity type which in two separate places forms a p-n junction with two respective semiconductor regions of the second conductivity type, the distance between the two p-n junctions being so small that in the operating condition punch-through occurs between the two p-n junctions before one of the two p-n junctions breaks down. In a switching element according to the invention the two diodes are integrated to form one assembly with a semiconductor region of the first conductivity type which is common to the two diodes. As is known, a depletion layer in which no free charge carriers are present is situated at the area of a p-n junction. Hence two depletion layers extend in the common semiconductor region of the first conductivity type. When a voltage is applied across the two diodes, the width of the depletion layer of the reverse-biased p-n junction increases to a greater extent when the voltage increases than the width of the depletion layer of the forward-biased p-n junction decreases. According to the invention, the thickness of the common semiconductor region of the first conductivity type is chosen to be so small that before the reverse biased p-n junction breaks down the depletion layers in the common semiconductor region of the first conductivity type meet each other or overlap each other. As a result of this, punch-through occurs between the two semiconductor regions of the second conductivity type. As a result of the punch-through effect, the common semiconductor region of the first conductivity type obtains a negligibly small resistance. As a result of this construction of the diodes, the series resistance across the switching element disappears so that a better switching ratio is obtained and a picture element can be driven with lower voltages than before.

It is to be noted that punch-through effects in series-arranged and oppositely arranged p-n junctions are known per se from Netherlands patent application No. 7801532 corresponding to U.S. Pat. No. 4,254,427 which relates to a ROM (read-only memory). However, this does not include the use as a switching element in a passive electro-optical display device.

A first embodiment of a display device in accordance with the invention is characterized in that the two semiconductor regions of the second conductivity type are situated in the same plane as the semiconductor region of the first conductivity type. The switching elements are constructed as a completely flat structure. This embodiment has the advantage that symmetrical switching elements can be manufactured in this flat structure in a simple manner.

A second embodiment in which the switching elements have a laminated structure is characterized in that the second semiconductor region of the second conductivity type is provided at least partly on the first semiconductor region of the second conductivity type, the two regions being separated from each other by the semiconductor region of the first conductivity type. This embodiment has the advantage that very small distances can be realized between the two semiconductor regions of the second conductivity type.

BRIEF DESCRIPTION OF THE DRAWING

Embodiments of the invention will now be described by way of example, with reference to the accompanying drawing, in which.

DESCRIPTION OF THE PREFERRED EMBODIMENTS

Figure 1:
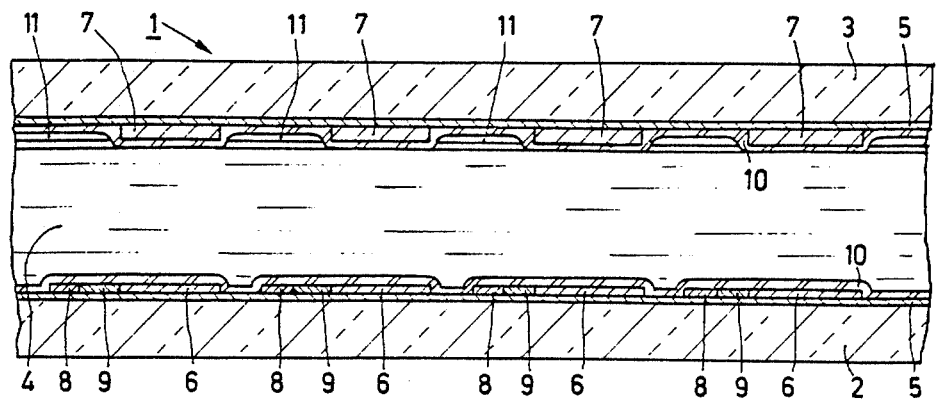
FIG. 1 is a diagrammatic sectional view of a part of a display device of the type to which the invention relates.

FIG. 1 is a sectional view of a part of a display device 1 having two supporting plates 2 and 3 between which a liquid crystal 4 is present. The inner surfaces of the supporting plates 2 and 3 have electrically and chemically insulating layers 5. A large number of picture electrodes 6 and 7 arranged respectively in rows and columns are provided on the supporting plates 2 and 3, respectively. The oppositely located picture electrodes 6 and 7 form the picture elements of the display device. Strip-shaped column electrodes 11 are provided between the columns of picture electrodes 7. The column electrodes 11 and the picture electrodes 7 can advantageously be integrated to strip-shaped electrodes. Strip-shaped row electrodes 8 are provided between the rows of picture electrodes 6. Each picture electrode 6 is connected to a row electrode 8 by means of a switching element 9 shown diagrammatically. The switching elements 9 give the liquid crystal 4 a sufficiently steep threshold with respect to the applied voltage and give the liquid crystal 4 a memory. Liquid crystal-orienting layers 10 are furthermore provided on the inner surfaces of the supporting plates 2 and 3. As is known, another orientation condition of the liquid crystal molecules and therewith an optically different condition can be obtained by applying a voltage across the liquid crystal layer 4. The display device can be realized both as a transmissive and as a reflective device.

Figure 2:
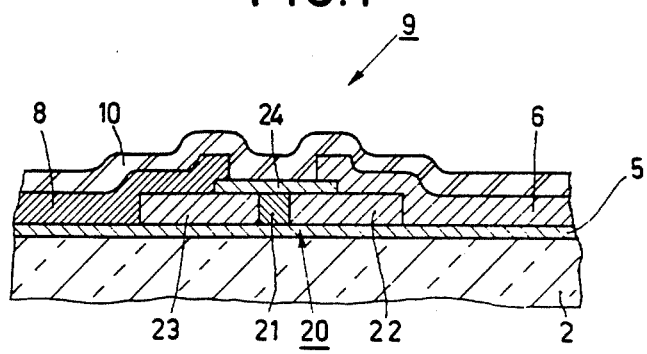
FIG. 2 is a sectional view of a first embodiment of a switching element for the display device shown in FIG. 1.

FIG. 2 is a sectional view of a first embodiment of the switching elements 9 shown diagrammatically in FIG. 1, in which like components are referred to by like reference numerals. A 0,2 $\mu$m thick electrically and chemically insulating layer 5 of silicon nitride is provided on the supporting plate 2. A 1 $\mu$m thick layer of preferably already p-doped polysilicon is then provided on the layer 5, in which former layer polysilicon islands 20 are formed by means of a photolithographic process. If the starting material is undoped polysilicon, a p-doping is provided in the islands, for example by ion implantation of boron, to give an active doping concentration of $1 \times 10^{15}$/cm$^3$. A mask is provided on the polysilicon islands 20 by means of a photolithographic process for providing in the regions 22 and 23 an n+ doping, for example by ion implantation of phosphorus, to give an active doping concentration of $1 \times 10^{18}$/cm$^3$. By providing the n+ doping, a flat n+-p-n+ structure is formed in the islands 20. The assembly is then annealed for 1 hour at a maximum temperature of 1,000° C. A 0,2 $\mu$m thick covering layer 24 of silicon oxide or silicon nitride is then provided over the p-doped region 21 and partly over the n+-doped regions 22 and 23. The picture electrodes 6 and the row electrodes 8 of indium oxide and/or tin oxide are then provided in a thickness of 0.15 $\mu$m in such manner that a picture electrode 6 covers the exposed surface of the n+-doped region 22 and a row electrode 8 covers the exposed surface of the n+-doped region 23. A 0.1 $\mu$m thick orienting layer 10 of a polyimide is then provided over the whole structure.

Figure 3:
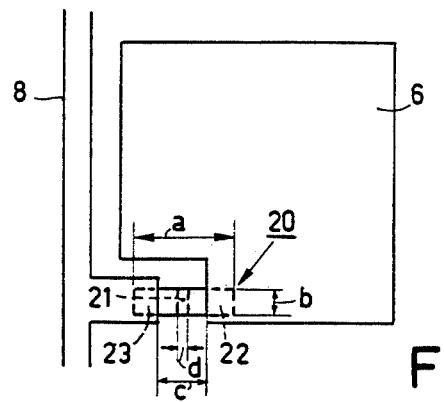
FIG. 3 is a plan view of the structure shown in FIG. 2.

FIG. 3 is a plan view of the structure shown in FIG. 2. The surface area of each picture electrode is approximately 250×250 $\mu$m$^2$. The polysilicon islands 20 each have a length a=50 $\mu$m and a width b=20 $\mu$m. The islands occupy only a very small area with respect to the area of the picture electrodes 6 so that the islands 20 are substantially unnoticable in the observed picture. The distance between the connection of each picture electrode 6 and the respective row electrode 8 is c=20 $\mu$m. The width of the p-doped region 21 is d=1 $\mu$m.

Figure 4:
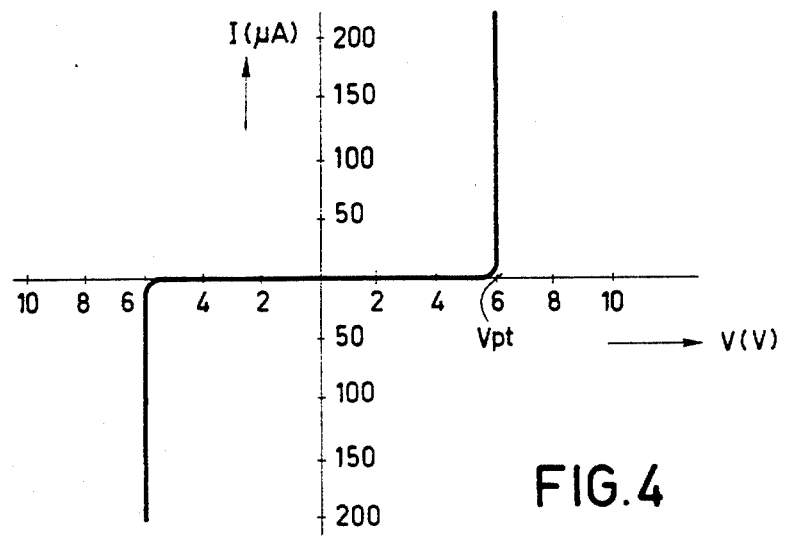
FIG. 4 shows a voltage-current characteristic of the switching element shown in FIGS. 2 and 3.

FIG. 4 shows the current voltage characteristic of the above-described switching element with the specified doping concentrations. The punch-through or threshold voltage of the switching element is $V_{pt}=6$ V. Above $V_{pt}$ the voltage V is substantially independent of the current I, so that the series resistance of the switching element is negligibly small. This is the result of the very small width d of the p-doped region 21. Under the influence of the applied voltage, the depletion layer of the reverse biased p-n junction expands to a greater extent in the region 21 than the depletion layer of the forward biased p-n junction decreases in the region. As a result of the small width d of the region 21, the two depletion layers meet each other and then overlap each other, before breakdown occurs. As a result of this, punch-through occurs between the two n+-regions 22 and 23, which are shortcircuited. As appears from the Figure, the characteristic is completely symmetrical, which is desirable because the display device is operated with alternating voltage to prevent undesired electrode processes by direct voltage drive. The value of the punch-through voltage $V_{pt}$, which is independent of the dimensions a and b of the switching element, can be adjusted by means of the doping concentrations and the width d of the region 21. The occurring reverse current can be minimized by suitable choice of the width b and the thickness of the switching elements.

Figure 5:
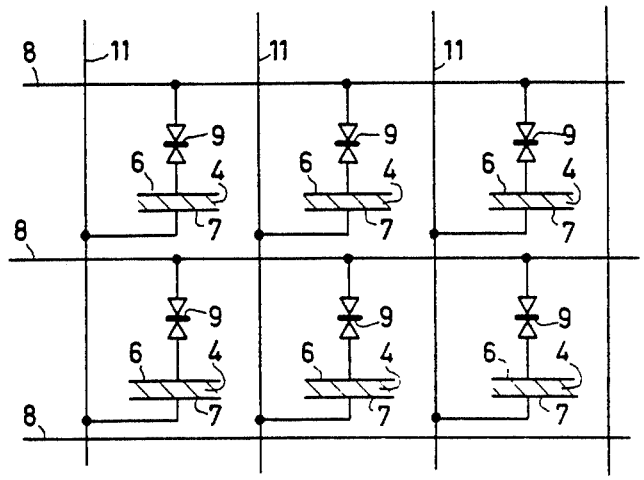
FIG. 5 shows the driving diagram of the display device shown in FIG. 1.

The driving of the display device will be described in greater detail with reference to FIG. 5. The picture elements formed by the picture electrodes 6 and 7 are connected between the row electrodes 8 and the column electrodes 11, a switching element 9 being connected in series with each picture element. Upon driving the display device, successively the row electrodes 8 are driven by voltage pulses $+V_s$. During the time a row electrode 8 is energized, voltage pulses $-V_d$ are applied to selected column electrodes 11. A voltage difference $V_s+V_d$ then exists across the selected column electrodes 11 and the associated row electrode 8. This voltage difference also exists across the series arrangement of the picture elements and the switching elements 9. The voltage difference $V_s+V_d$ is larger than the threshold voltage $V_{pt}$ of the switching elements 9. As a result of this a part of the voltage difference $V_s+V_d$ appears across the driven picture elements, which is sufficient to bring the liquid crystal 4 at the area of the picture elements to a different orientation condition. Voltage pulses $+V_d$ are applied to the non-selected column electrodes 11. A voltage difference $V_s-V_d$ then exists across non-selected column electrodes 11 and the row electrodes 8. This voltage difference $V_s-V_d$ is smaller than the threshold voltage $V_{pt}$ of the switching elements so that they are not energized. The voltage pulses $\pm V_d$ are smaller than the threshold voltage $V_{pt}$ of the switching elements 9. This prevents information being written in picture elements of non-driven row electrodes 8. After the information has been written on a driven row electrode 8, the next row electrode 8 is energized. As a result of this, the voltage across the switching elements 9 of the row electrode 8 driven earlier becomes smaller than the threshold voltage $V_{pt}$ of the switching elements, so that one of the p-n junctions is reverse-biased and the written information cannot leak away directly via the switching elements 9. This results in a long retention time which is determined by the reverse current of the switching elements 9. As a result of the long retention time it is possible to successively drive a very large number of rows and to provide them with information It is to be noted that both the row electrodes and column electrodes may serve as control electrodes or information electrodes.

Figure 6:
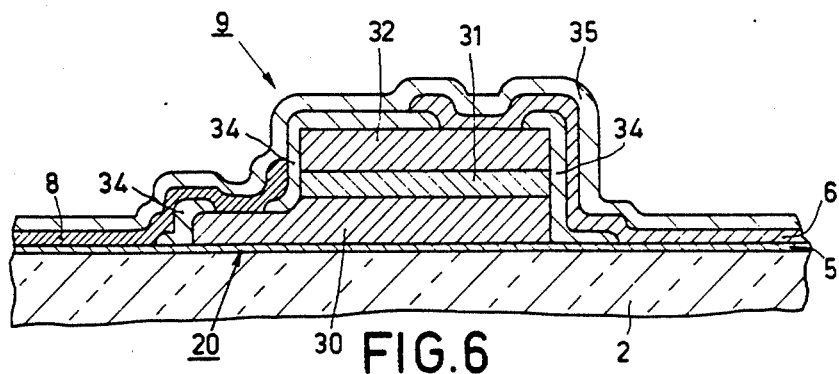
FIG. 6 is a sectional view of a second embodiment of a switching element for the display device shown in FIG. 1.

FIG. 6 shows a second embodiment of the switching elements 9 shown diagrammatically in FIG. 1. Like components are referred to by like reference numerals as in FIG. 1. First, a 0.2 μm thick electrically and chemically insulating layer 5 of silicon nitride is provided on the supporting plate 2. A 1 μm thick n+ doped layer 30 of polysilicon, a 0.1 to 1 μm thick p-doped layer 31 of polysilicon and again a 1 μm thick n+-doped layer 32 of polysilicon are provided successively on the layer 5 by means of chemical vapour-deposition methods. The doping concentrations are in the same order of magnitude as in the embodiment described with reference to FIG. 2. If desired, a 0,1 μm thick covering layer (capping layer) of undoped polysilicon may be provided between the two n+-p junctions. By means of a photolithographic process, polysilicon islands 20 are formed. A mask is then provided photolithographically so as to etch away a part of the polysilicon island 20 and to thus create a contact possibility with the n+-doped layer 30. A 0.2 μm thick capping layer 34 of silicon oxide or silicon nitride is then provided over the whole island 20. Contact holes are etched therein photolithographically for the 0.15 μm thick picture electrodes 6 and row electrodes 8 of indium oxide and/or tin oxide to be provided afterwards, in such manner that the picture electrode 6 contacts the exposed surface of the n+-doped region 32 and the row electrode 8 contacts the exposed surface of the n+-doped region 30. A 0.1 μm thick liquid crystal-orienting layer 35 of a polymer is then provided over the whole structure.

It is to be noted that the stacked n+-p-n+ structure can also be realized by successively implanting a 2 μm thick undoped layer of polysilicon with, for example, phosphorus, boron, and again phosphorus with such an energy that the concentration maxima are sufficiently spaced to form separated n+, p and n+ doped regions.

It will be obvious that the invention is not restricted to the above-described embodiments. In addition to the n-p-n structures shown, the switching elements may also be constructed in a p-n-p structure. Besides liquid crystal display devices, the switching elements may also be used with other display media having substantially no threshold and/or no intrinsic memory, for example, electrophoretic and electroceramic display media.

What is claimed is:

1. A display apparatus comprising first and second spaced-apart supporting plates; an electro-optical display medium disposed between the supporting plates; a plurality of picture elements, each defined by a first picture electrode disposed on the first supporting plate and a second picture electrode disposed on the second supporting plate; first and second arrangements of driving electrodes disposed on the first and second supporting plates, respectively, each picture electrode being electrically connected to a predetermined one of the driving electrodes on the respective supporting plate; and a plurality of switching elements, each electrically connected in series with a respective one of the picture electrodes and the driving electrode electrically connected thereto;

characterized in that each switching element comprises a punch-through diode device having three regions, each of p-type or n-type semiconductor material, said regions including a central region formed from one of said types of semiconductor material and including two outer regions formed from the other of said types of semiconductor material, each outer region forming a respective p-n junction with the central region, the distance between the p-n junctions being sufficiently small that, when a predetermined switching voltage is applied across the device, punch-through occurs between said junctions between either one of the junctions breaks down.

2. A display device as in claim 1 where each punch-through diode device comprises a single layer of semiconductor material in which said regions are formed.

3. A display device as in claim 1 where each punch-through diode device comprises a separate layer for each region.

4. A display device as in claim 1, 2 or 3 where said electro-optical display medium comprises liquid crystal.

5. A display device as in claim 1, 2 or 3 where said electro-optical display medium comprises an electrophoretic suspension.

6. A display device as in claim 1, 2 or 3 where said electro-optical display medium comprises an electrochromic material.

* * * * *